(12) United States Patent
Jou et al.

(10) Patent No.: US 8,546,907 B2
(45) Date of Patent: Oct. 1, 2013

(54) ENHANCED TRANSMISSION LINES FOR RADIO FREQUENCY APPLICATIONS

(75) Inventors: Chewn-Pu Jou, Hsin-Chu (TW); Ho-Hsiang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 486 days.

(21) Appl. No.: 12/697,908

(22) Filed: Feb. 1, 2010

(65) Prior Publication Data

US 2010/0264509 A1 Oct. 21, 2010

Related U.S. Application Data

(60) Provisional application No. 61/169,614, filed on Apr. 15, 2009.

(51) Int. Cl.
*H01L 21/70* (2006.01)
(52) U.S. Cl.
USPC .................. 257/504; 257/348; 257/E27.061; 257/E29.018

(58) Field of Classification Search
USPC .................. 257/504, 348, E27.061, E29.018
See application file for complete search history.

(56) References Cited

U.S. PATENT DOCUMENTS

| | | | |
|---|---|---|---|
| 5,525,822 A | 6/1996 | Vinal | |
| 5,705,963 A * | 1/1998 | Ikeda et al. | 333/184 |
| 6,201,289 B1 | 3/2001 | Jou | |
| 6,242,791 B1 * | 6/2001 | Jou | 257/531 |
| 6,373,121 B1 | 4/2002 | Pan | |
| 7,061,067 B2 * | 6/2006 | Tanaka et al. | 257/484 |
| 2007/0241365 A1 * | 10/2007 | Iwamatsu | 257/147 |

* cited by examiner

*Primary Examiner* — Julio J Maldonado
*Assistant Examiner* — Hajar Kolahdouzan
(74) *Attorney, Agent, or Firm* — Slater & Matsil, L.L.P.

(57) ABSTRACT

An integrated circuit structure includes a semiconductor substrate of a first conductivity type; a depletion region in the semiconductor substrate; and a deep well region substantially enclosed by the depletion region. The deep well region is of a second conductivity type opposite the first conductivity type, and includes a first portion directly over the deep well region and a second portion directly under the deep well region. A transmission line is directly over the depletion region.

19 Claims, 4 Drawing Sheets

ENHANCED TRANSMISSION LINES FOR RADIO FREQUENCY APPLICATIONS

This application claims the benefit of U.S. Provisional Application No. 61/169,614 filed on Apr. 15, 2009, entitled "Enhanced Transmission Lines for Radio Frequency Applications," which application is hereby incorporated herein by reference.

TECHNICAL FIELD

This invention relates generally to integrated circuits, and more particularly to high-frequency integrated circuit devices, and even more particularly to structures for reducing signal loss in substrates and methods for forming the same.

BACKGROUND

High-frequency circuits are commonly used in modern applications such as wireless communication applications. A common problem faced by designers is signal loss in the substrates that are underlying the high-frequency circuits, which signal loss is partially caused by the parasitic capacitors formed between the high-frequency circuits and the underlying substrates. Typically, with the increase in the frequency of the signals, loss also increases. This significantly limits the design of high-frequency circuits.

FIG. 1 illustrates conventional radio frequency (RF) transmission line 10 formed over semiconductor substrate 2. RF transmission line 10 includes signal lines 6 for transmitting signals. Shielding metal pattern 4 is formed between semiconductor substrate 2 and RF transmission line 10. Shielding metal pattern 4 may be grounded. Dielectric layer(s) 8 separates RF transmission line 10 from semiconductor substrate 2. Although shielding metal pattern 4 is used to shield the signals transmitted in signal lines 6 from being coupled to semiconductor substrate 2, due to the fact that the thickness and the area of shielding metal pattern 4 is limited, parasitic capacitors 12 are still formed between signal lines 6 and semiconductor substrate 2. The undesirable parasitic capacitors 12 limit the operation frequency of RF transmission line 10 to about 10 GHz and below. When the frequency is further increased, the signal loss in semiconductor substrate 2 significantly increases.

Further, the signal loss problem may be worsened by the increasing down-scaling of integrated circuits, which causes a reduction in distances between the high-frequency transmission lines and the respective underlying substrates. The reduced distances result in an increase in parasitic capacitances. Solutions are thus needed to solve the above-discussed problems.

SUMMARY OF THE INVENTION

In accordance with one aspect of the present invention, an integrated circuit structure includes a semiconductor substrate of a first conductivity type; a depletion region in the semiconductor substrate; and a deep well region substantially enclosed by the depletion region. The deep well region is of a second conductivity type opposite the first conductivity type, and includes a first portion directly over the deep well region and a second portion directly under the deep well region. A transmission line is directly over the depletion region.

In accordance with another aspect of the present invention, an integrated circuit structure includes a semiconductor substrate of a first conductivity type; and a deep well region in the semiconductor substrate and having a top surface lower than a top surface of the semiconductor substrate. The deep well region is of a second conductivity type opposite the first conductivity type. The integrated circuit structure further includes a voltage source coupled to the deep well region; a transmission line directly over the deep well region; and a dielectric layer spacing the transmission line apart from the top surface of the semiconductor substrate.

The advantageous features of the embodiments include reduced signal loss for high-frequency transmission lines, particularly for radio frequency transmission lines. In addition, the embodiments may be integrated with existing manufacturing processes without requiring additional process steps and lithography masks.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel substrate-loss reduction structure and a method of forming the same are presented. The intermediate stages of manufacturing embodiments of the present invention are discussed. The variations of the embodiments are also discussed. Throughout the various views and illustrative embodiments of the present invention, like reference numbers are used to designate like elements.

Figure 1:
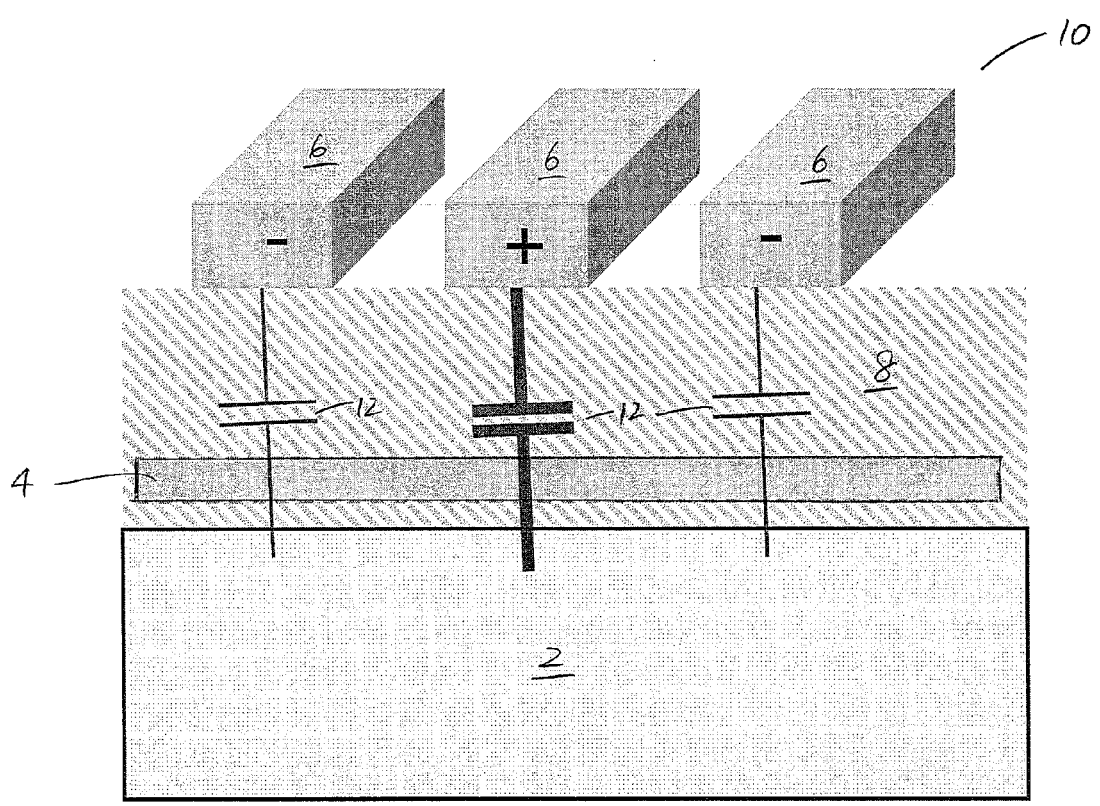
FIG. 1 illustrates a conventional radio frequency (RF) transmission line formed over a semiconductor substrate.
Figure 2A:
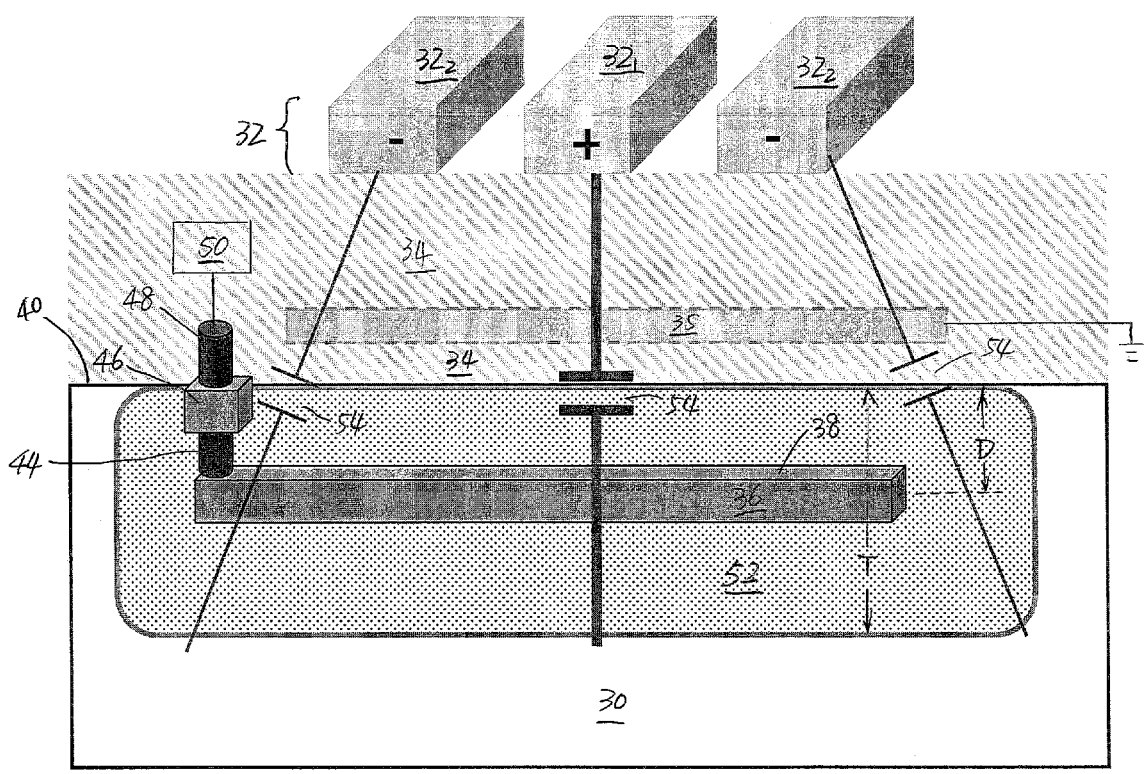
FIGS. 2A and 2B illustrate a perspective view and a top view of a transmission line in accordance with an embodiment.

FIG. 2A illustrates a perspective view of an embodiment of the present invention, which includes substrate 30. Substrate 30 may be a semiconductor substrate comprising silicon, germanium, GaAs, and/or other commonly used semiconductor materials. Substrate 30 may be a bulk substrate or have a semiconductor-on-insulator structure. In an embodiment, substrate 30 is lightly doped with a p-type impurity, for example, with a concentration of lower than about $10^{11}/cm^3$, and hence is referred to as being a P-substrate hereinafter. Alternatively, substrate 30 may be lightly doped with an n-type impurity.

Transmission lines 32 are formed over P-substrate 30. In an embodiment, transmission lines 32 include central signal line $32_1$ and additional lines $32_2$. In an embodiment, central signal line $32_1$ is used for transmitting signals, while additional lines $32_2$ are grounded. In alternative embodiments, central signal line $32_1$ and additional lines $32_2$ are used for transmitting differential signals. In yet other embodiments, only central signal line $32_1$ is formed (which is a microstrip line), while additional lines $32_2$ are not formed. It is realized that transmission lines may have many embodiments, which embodiments are in the scope of the present invention. Transmission lines 32 may be designed to transmit radio frequency (RF) signals, for example, having a frequency of greater than about 1 GHz, or even greater than about 10 GHz.

Shielding pattern 35 may be formed directly underlying transmission lines 32. In an embodiment, shielding pattern 35 is a continuous metal plate, which may have an area greater than the overlying transmission lines 32, although the area may be smaller. In alternative embodiments, shielding pattern 35 may be formed of parallel metal lines, or have a grid structure. Shielding pattern 35 may also be omitted. Shielding pattern 35 may be formed in a lower metallization layer, such as in the bottom metallization layer (commonly known as M1).

Transmission lines 32 are formed over substrate 30. Space 34 between transmission lines 32 and substrate 30 may include dielectric layers such as inter-layer dielectrics (ILDs), in which gate electrodes of transistors (not shown) and contact plug 48 are formed, and possibly inter-metal dielectrics (IMDs), in which metal lines and vias (not shown) are formed. Transmission lines 32 may be formed in any of the upper metallization layer(s).

Deep N-well region(s) 36 is formed in substrate 30, and has top surface 38 lower than top surface 40 of substrate 30. Top surface 40 may be the interface between semiconductor substrate 30 and an overlying dielectric layer. In an embodiment, deep N-well region 36 is formed by implanting an n-type impurity, such as phosphorous or arsenic, deeply into substrate 30. Alternatively, deep N-well region 36 may be formed by diffusing or doping a surface layer of substrate 30 to form deep N-well region 36, and then epitaxially growing a p-type layer over deep N-well region 36. Accordingly, deep N-well region 36 is buried inside substrate 30, with a lightly doped p-type (p-) layer over deep N-well region 36. It is appreciated that due to the distribution of the implanted n-type impurity, deep N-well region 36 may not have sharp top and bottom surfaces. In an exemplary embodiment, a middle level of deep N-well region 36, which is between the top and bottom surfaces of deep N-well region 36, has depth D of about 1 μm. One skilled in the art will realize, however, that the dimensions recited throughout the description are merely examples, and will change if different formation technologies are used.

Deep N-well region 36 is connected to voltage source 50 through n-type plug 44, n-type plug 46, and contact plug 48. In an embodiment, n-type plug 44 is formed simultaneously with n-well regions, which are used for forming pMOS transistors (not shown) therein. Accordingly, n-type plug 44 has substantially the same impurity concentration as the n-well regions. Top surface 38 (which is the interface between N-well region 36 and the overlying p-layer) of deep N-well region 36 is no lower than the bottom surface of the n-type plug 44 so that they join each other. N-type plug 46 may be formed simultaneously with the formation of source/drain regions of nMOS transistors (not shown), and hence may be an N+region having a concentration, for example, greater than about $1 \times 10^{18}/cm^3$, or even greater than about $1 \times 10^{20}/cm^3$. Contact plug 48 may be formed in the ILD, and may be formed simultaneously with the formation of contact plugs (not shown) that are connected to the source/drain regions and gate electrodes of the pMOS and nMOS transistors. It is noted that deep N-well region 36 may be connected to voltage source 50 using any other applicable connections.

Voltage source 50 provides a positive bias voltage to deep N-well region 36. Accordingly, depletion region 52 is formed in the portion of substrate 30 that encloses deep N-well region 36. In an embodiment, the voltage applied to deep N-well region 36 is high enough to deplete the portion of substrate 30 directly over deep N-well region 36. In other words, depletion region 52 extends to top surface 40 of substrate 30. It is realized that parasitic capacitors 54 exist between transmission lines 32 and substrate 30. The formation of depletion region 52 has the effect of increasing the equivalent thickness of capacitor insulators of parasitic capacitors 54 by the thickness of depletion region 52. As a result, the capacitance of parasitic capacitors 54 is reduced, resulting in a reduced signal loss in substrate 30 (which signal loss is referred to as substrate loss hereinafter). In an embodiment, the total parasitic capacitance of all parasitic capacitors 54 may be reduced by about 50 percent.

To maximize the parasitic-capacitance reduction effect, thickness T of depletion region 52 is preferably increased, which may be achieved by increasing the positive bias voltage. In an embodiment, the bias voltage is equal to operation voltage VDD, which is the positive power supply voltage provided to core circuits, although the bias voltage may also be any other positive voltage. To further increase the size of depletion region 52, the positive bias voltage may be increased to higher than voltage VDD. For example, voltage source 50 may be an input/output (I/O) voltage source providing a positive power supply voltage higher than voltage VDD.

Figure 2B:
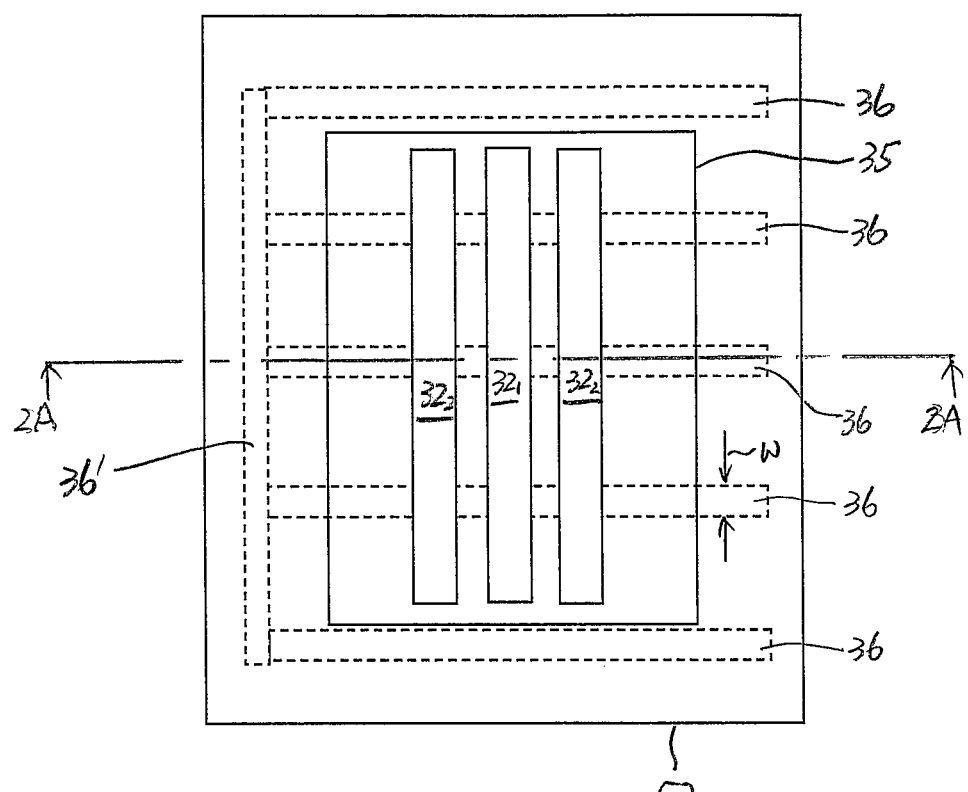

FIG. 2B illustrates an exemplary top view of transmission lines 32, deep N-well region 36, and depletion region 52. The cross-sectional view shown in FIG. 2A may be obtained from a plane crossing line 2A-2A in FIG. 2B. Depletion region 52 may be a continuous region that extends beyond edges of transmission lines 32 in all horizontal-plane directions (the directions parallel to the surface of substrate 30). Accordingly, depletion region 52 may have an area (viewed from the top) at least substantially close to, and even greater than, the area of transmission lines 32 and the areas therebetween. The area of depletion region 52 may also be greater than the area of transmission lines 32 by 10 percent, or even by 100 percent. Further, the area of depletion region 52 may also be greater than the area of shielding metal pattern 35 by 10 percent, or even by 100 percent. Advantageously, the increase in the area of depletion region 52 may reduce the capacitance of parasitic capacitor 54 as shown in FIG. 2A. In an embodiment, deep N-well region 36 includes a plurality of parallel fingers (also denoted as 36) that are spaced apart by portions of P-substrate 30. The parallel fingers 36 may be connected through deep N-well region 36'. In order to reduce the induced currents that may form in deep N-well region 36, the fingers are preferably as narrow as possible, with width W being close to, or even equal to the dimension defined by the minimum rule (the minimum width allowed by the forming technology). When the bias voltage is applied, the depletion regions generated by neighboring fingers are overlapped to form continuous depletion region 52. In alternative embodiments, deep N-well region 36 may have any other pattern, such as a grid, as long as it can form continuous depletion region 52. In yet other embodiments, deep N-well region 36 may be a continuous N-well plate.

Although in the embodiments discussed in the preceding paragraphs, positive voltages are used to bias deep N-well region 36 to form depletion region 52 in p-type substrate 30, in alternative embodiments, the conductivity types of regions 30, 36, 44, 46, 48, and the like, may be inversed. In this case, deep well region 36, which is now of p-type, may be biased with negative voltages to form depletion regions 52.

Figure 3:
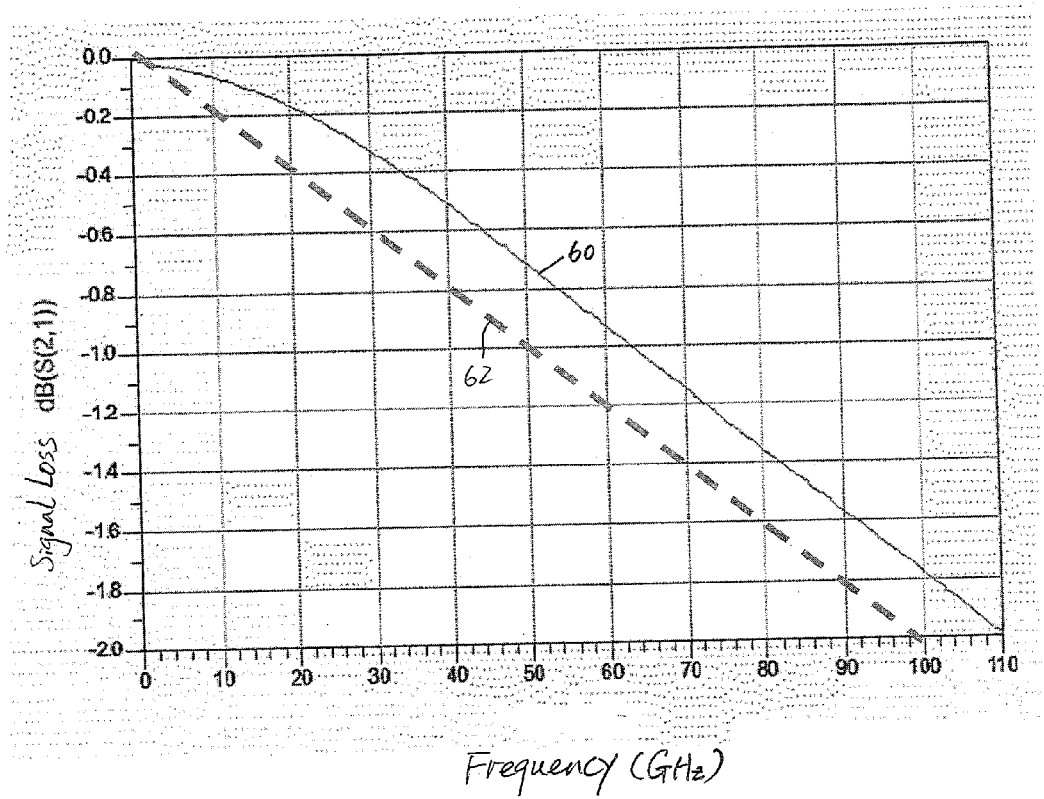
FIG. 3 shows a comparison of simulation results obtained from a conventional transmission line and an embodiment of the present invention.

FIG. 3 illustrates simulation results obtained from transmission line samples, wherein signal losses (Y-axis) are illustrated as functions of frequencies (X-axis). The simulated transmission line samples have widths equal to 30 μm and lengths equal to 150 μm. Solid line 60 is obtained from signal line samples including depletion regions underlying the transmission line samples. Dotted line 62 is obtained from samples having conventional structures with no depletion regions underlying the transmission line samples. It is noted that at a frequency of about 30 GHz or greater, the signal loss indicated by line 60 is less than the signal loss represented by line 62 by about 2 decibels. The remaining losses indicated by line 60 are mainly metal line losses, while over 90 percent of the substrate loss has been eliminated due to the formation of the depletion regions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a semiconductor substrate of a first conductivity type;
   a depletion region in the semiconductor substrate;
   a deep well region substantially enclosed by the depletion region, wherein the deep well region is of a second conductivity type opposite the first conductivity type, and wherein the depletion region comprises a first portion directly over the deep well region and a second portion directly under the deep well region; and
   a transmission line directly over the depletion region.

2. The integrated circuit structure of claim 1, wherein the deep well region is of n-type, and wherein a portion of the semiconductor substrate directly over the deep well region and a portion of the semiconductor substrate directly under the deep well region are of p-type.

3. The integrated circuit structure of claim 2 further comprising a voltage source connected to the deep well region, wherein the voltage source is configured to provide a positive voltage to the deep well region.

4. The integrated circuit structure of claim 3, wherein the positive voltage is a positive power supply voltage of a core circuit.

5. The integrated circuit structure of claim 3, wherein the positive voltage is a positive power supply voltage of an input/output circuit.

6. The integrated circuit structure of claim 1, wherein the transmission line comprises a signal line.

7. The integrated circuit structure of claim 6, wherein the transmission line further comprises grounded lines on opposite sides of, and parallel to, the signal line.

8. The integrated circuit structure of claim 1 further comprising a shielding metal vertically between the transmission line and the semiconductor substrate.

9. The integrated circuit structure of claim 1, wherein the depletion region has an area substantially no less than an area of the transmission line.

10. The integrated circuit structure of claim 1, wherein the deep well region comprises a plurality of deep well fingers parallel to each other, and wherein the plurality of deep well fingers is interconnected.

11. The integrated circuit structure of claim 10, wherein widths of the plurality of deep well fingers are close to a minimum width of a technology for forming the integrated circuit structure.

12. An integrated circuit structure comprising:
    a semiconductor substrate of a first conductivity type;
    a deep well region in the semiconductor substrate and having a top surface lower than a top surface of the semiconductor substrate, wherein the deep well region is of a second conductivity type opposite the first conductivity type;
    a voltage source coupled to the deep well region;
    a transmission line directly over the deep well region; and
    a dielectric layer spacing the transmission line apart from the top surface of the semiconductor substrate.

13. The integrated circuit structure of claim 12, wherein the first conductivity is p-type, and the second conductivity type is n-type, and wherein the voltage source is configured to provide a positive voltage.

14. The integrated circuit structure of claim 13, wherein the voltage source is configured to provide a positive power supply voltage of a core circuit to the deep well region.

15. The integrated circuit structure of claim 12, wherein the first conductivity type is n-type, and the second conductivity type is p-type, and wherein the voltage source is configured to provide a negative voltage.

16. The integrated circuit structure of claim 12 further comprising a depletion region substantially encircling the deep well region, wherein the depletion region extends from a top surface of the deep well region to the top surface of the semiconductor substrate, and wherein the depletion region has an area substantially no less than an area of the transmission line.

17. The integrated circuit structure of claim 16, wherein the area of the depletion region is greater than the area of the transmission line, and wherein the depletion region laterally extends beyond respective edges of the transmission line in substantially all lateral directions.

18. The integrated circuit structure of claim 16, wherein the deep well region comprises a plurality of deep well fingers, with the depletion region extending between the plurality of deep well fingers, wherein the plurality of deep well fingers is configured to receive a voltage applied by the voltage source.

19. The integrated circuit structure of claim 16, wherein the transmission line comprises a signal line, and a grounded line on a side of, and parallel to, the signal line.

* * * * *